United States Patent
Huang et al.

(10) Patent No.: US 6,265,274 B1
(45) Date of Patent: Jul. 24, 2001

(54) METHOD OF A METAL OXIDE SEMICONDUCTOR ON A SEMICONDUCTOR WAFER

(75) Inventors: Jui-Tsen Huang, Taipei; Chien-Hua Tsai, Tai-Chung, both of (TW)

(73) Assignee: United Microelectronics Corp., Hsin-Chu (TW)

( * ) Notice: Subject to any disclaimer, the term of this patent is extended or adjusted under 35 U.S.C. 154(b) by 0 days.

(21) Appl. No.: 09/431,954

(22) Filed: Nov. 1, 1999

(51) Int. Cl.$^7$ .................................................. H01L 21/336
(52) U.S. Cl. ............................................................. 438/305
(58) Field of Search ............................ 438/305, FOR 188

(56) References Cited

U.S. PATENT DOCUMENTS

| | | | |
|---|---|---|---|
| 5,234,850 | * | 8/1993 | Liao . |
| 5,770,508 | * | 6/1998 | Yeh et al. . |
| 5,817,562 | * | 10/1998 | Chang et al. . |
| 5,851,890 | * | 12/1998 | Tsai et al. . |
| 5,970,352 | * | 10/1999 | Shiozawa et al. . |
| 5,972,764 | * | 10/1999 | Huang et al. . |
| 5,976,939 | * | 11/1999 | Thompson et al. . |
| 6,087,234 | * | 7/2000 | Wu . |
| 6,127,212 | * | 10/2000 | Chen et al. . |
| 6,165,857 | * | 12/2000 | Yeh et al. . |

* cited by examiner

*Primary Examiner*—George Fourson
*Assistant Examiner*—Michelle Estrada
(74) *Attorney, Agent, or Firm*—Winston Hsu

(57) ABSTRACT

A semiconductor wafer comprises a silicon substrate, and a dielectric layer. A gate is formed on the dielectric layer. A first silicon oxide layer is uniformly formed on the semiconductor wafer. A first ion implantation process is performed to form two doped areas on the silicon substrate that are used as two lightly doped drains of a MOS transistor. A second silicon oxide layer is formed on the semiconductor wafer. A sacrificial layer is formed on the second silicon oxide layer. A first etching process is performed to remove the sacrificial layer on top of the gate, causing the gate to protrude from the remaining sacrificial layer for a predetermined height. A second etching process is performed to remove the first and second silicon oxide layers on the protruding portion of the gate. After removing the sacrificial layer completely, a silicon nitride layer is uniformly formed on the semiconductor wafer. A third etching process is performed to vertically remove the silicon nitride layer on top of the gate, thereby forming a spacer. Finally, a second ion implantation process is performed to form two doped areas on the silicon substrate, which are used as source and drain of the MOS transistor.

10 Claims, 8 Drawing Sheets

METHOD OF A METAL OXIDE SEMICONDUCTOR ON A SEMICONDUCTOR WAFER

BACKGROUND OF THE INVENTION

1. Field of the Invention

The present invention relates to a method of forming a metal oxide semiconductor on a semiconductor wafer, and more particularly, to a method of forming a spacer of a metal oxide semiconductor on a semiconductor wafer.

2. Description of the Prior Art

A gate, a drain and a source comprise a MOS transistor. The performance of the MOS transistor depends on the structure of the gate and its spacer. During the general method of forming the MOS transistor, the gate is formed on the silicon substrate of a semiconductor wafer first, and then two spacers are formed on the two vertical sides of the gate. An ion implantation process is performed to form a drain and source on the silicon substrate outside the gate, with the gate and spacers serving as a mask during the process. However, with critical dimension reductions, the prior art formation of the spacer is no longer satisfactory, adversely affecting the quality of the resulting semiconductor devices.

Please refer to FIG. 1 to FIG. 5. FIG. 1 to FIG. 4 are schematic diagrams of the prior art formation of a MOS transistor 20. The prior art formation of the MOS transistor 20 is performed on a semiconductor wafer 10. As shown in FIG. 1, the semiconductor wafer 10 comprises a silicon substrate 12, a dielectric layer 14 positioned on the silicon substrate 12 to serve as a gate oxide layer, and a gate 16 with at least two vertical sides positioned on a predetermined region of the dielectric layer 14. Each gate 16 comprises a conductive layer 11 positioned on the predetermined region of the dielectric layer 14, a silicide layer 13 positioned above the conductive layer 11 to reduce the interface resistance of the conductive layer 11, a passivation layer 15 positioned above the silicide layer 13, and an anti-reflection coating (ARC) layer 17 positioned above the passivation layer 15. The dielectric layer 14 is made of silicon oxide, the conductive layer 11 is made of doped poly-silicon, the silicide layer 13 is made of tungsten silicide (WSi), the passivation layer 15 is made of silicon nitride and the ARC layer 17 is made of silicon nitride oxide (SiON).

As shown in FIG. 2, a silicon oxide layer 18, 100 Å thick, is formed on the semiconductor wafer 10, uniformly covering the gate 16 and the dielectric layer 14. Then, a first ion implantation process is performed to form two first doped regions 22 that function as the lightly doped drain of the MOS transistor 20. Next, a silicon nitride layer 24 is uniformly formed on the semiconductor wafer 10, entirely covering the silicon nitride layer 18.

As shown in FIG. 3, an anisotropic dry etching process is performed to vertically remove both the silicon nitride layer 24 and the silicon oxide layer 18 above the gate 16. The remaining silicon nitride layer 24 on the vertical sides of the gate 16 becomes a spacer 25. As shown in FIG. 4, finally, a second ion implantation process is performed to dope the silicon substrate 12 not covered by the spacers 25. This forms a second doped region 26 under the first doped region 22 that functions as the source and drain of the MOS transistor 20.

In the prior art method, during the dry etching process to form the spacers 25, a portion of the dielectric layer 14 between two spacers 25 will also be etched. Therefore, during the second ion implantation process, the thickness of the dielectric layer 14 will not be sufficient enough to protect the silicon substrate 12. Consequently, the surface of the silicon substrate will become very rugged.

Furthermore, the vertical sides of the gate 16 of the MOS transistor 20, covered with the silicon oxide layer 18, are vulnerable to short-circuiting when forming a subsequent contact plug 29. Please refer to FIG. 5. FIG. 5 is a cross-sectional diagram of the contact plug 29 of the MOS transistor 20 shown in FIG. 4. After the MOS transistor 20 is completed, the contact plug 29 must be formed on the semiconductor wafer 10 so that the MOS transistor 20 has an electrical connection with a subsequent metal layer (not shown). The prior art method comprises depositing another dielectric layer 27 on the semiconductor wafer 10, performing a self-aligned etching process to form a contact hole 28, and filling dielectric material into the contact hole 28 to form the contact plug 29. However, during the etching process, if the position of the contact hole 28 is not precisely defined, the silicon oxide layer 18 on the vertical sides of the gate 16 may also be etched, resulting in short-circuiting between the gate 16 and the contact plug 29.

SUMMARY OF THE INVENTION

It is therefore a primary objective of the present invention to provide a method of forming a MOS transistor on a semiconductor wafer to solve the above mentioned problems.

In a preferred embodiment, the present invention relates to a method of forming a metal oxide semiconductor (MOS) on a semiconductor wafer, the semiconductor wafer comprising a silicon substrate, and a dielectric layer positioned on the silicon substrate, the method comprising:

forming a gate on at least one predetermined region of the dielectric layer;

forming a first silicon oxide layer uniformly on the semiconductor wafer, the first silicon oxide layer covering the gate;

performing a first ion implantation process to form two doped areas on the silicon substrate at two opposite sides of the gate that are used as two lightly doped drains of the MOS transistor;

forming a second silicon oxide layer on the semiconductor wafer, the second silicon oxide layer covering the first silicon oxide layer;

forming a sacrificial layer on the second silicon oxide layer;

performing a first etching process to remove the sacrificial layer on top of the gate, making the gate protrude from the remaining sacrificial layer for a predetermined height;

performing a second etching process to remove the first and second silicon oxide layers on the protruding portion of the gate;

removing the sacrificial layer completely;

forming a silicon nitride layer uniformly on the semiconductor wafer, the silicon nitride layer covering the protruding portion of the gate and the remaining first and second silicon oxide layers;

performing a third etching process to vertically remove the silicon nitride layer on top of the gate and form a spacer on the surrounding portion of the gate;

performing a second ion implantation process to form two doped areas on the silicon substrate on two opposite sides of the spacer which are used as source and drain of the MOS transistor.

It is an advantage of the present invention that the surface of the silicon substrate will not be coarsened by the ion implantation process and that no short-circuiting will occur between the gate and a subsequent contact plug.

These and other objectives of the present invention will no doubt become obvious to those of ordinary skills in the art after reading the following detailed description of the various figures and drawings.

DETAILED DESCRIPTION OF THE PREFERRED EMBODIMENT

Figure 1:
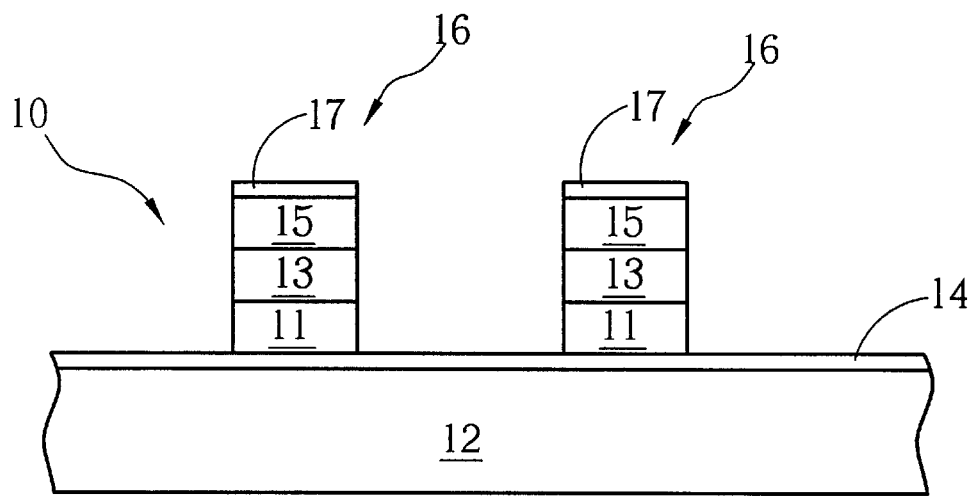
FIG. 1 to FIG. 4 are schematic diagrams of the prior art formation of a MOS transistor.
Figure 2:
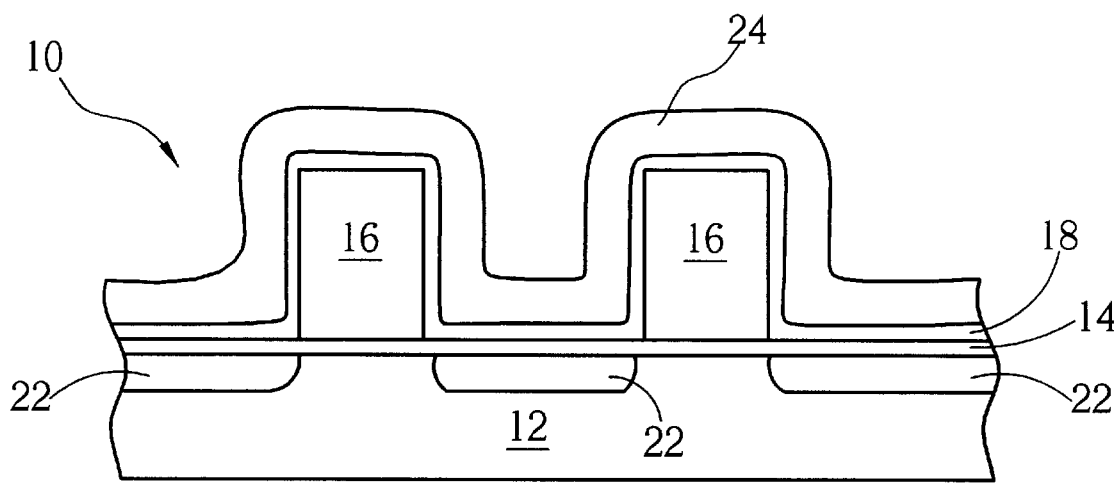
Figure 3:
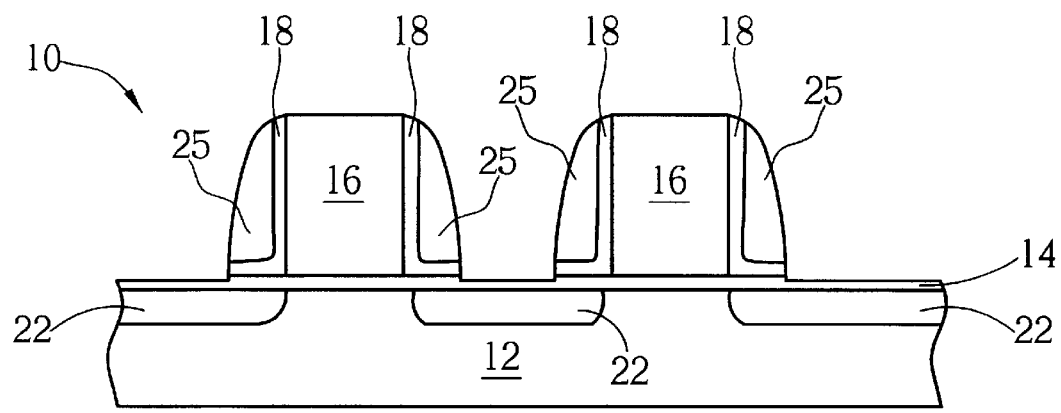
Figure 4:
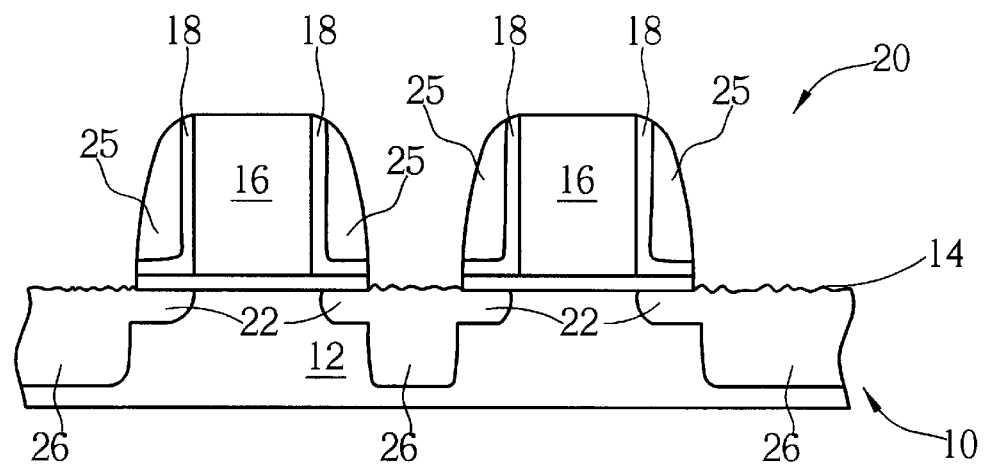
Figure 5:
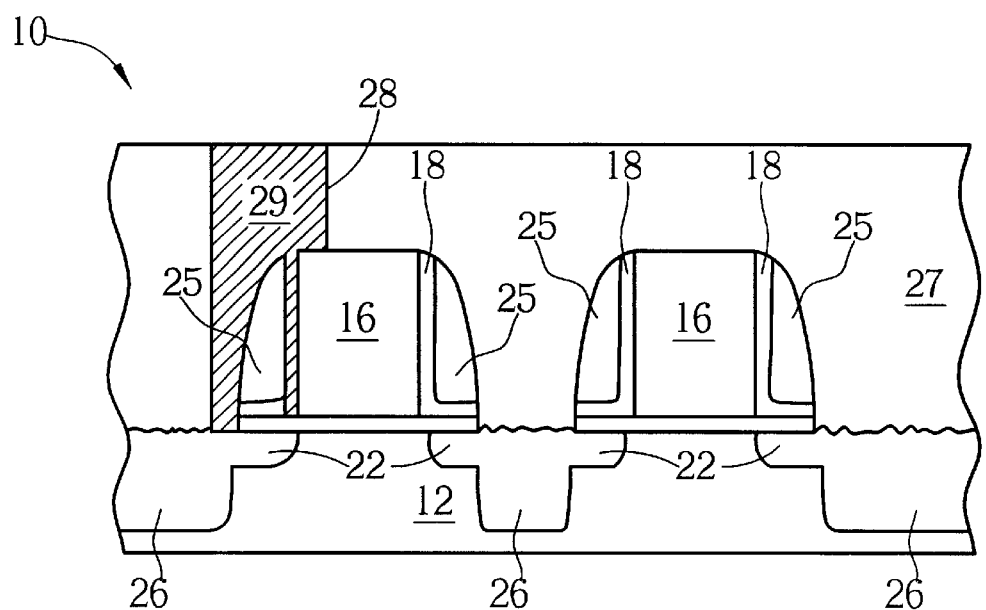
FIG. 5 is a cross-sectional diagram of a contact plug 29 of a MOS transistor shown in FIG. 4.
Figure 6:
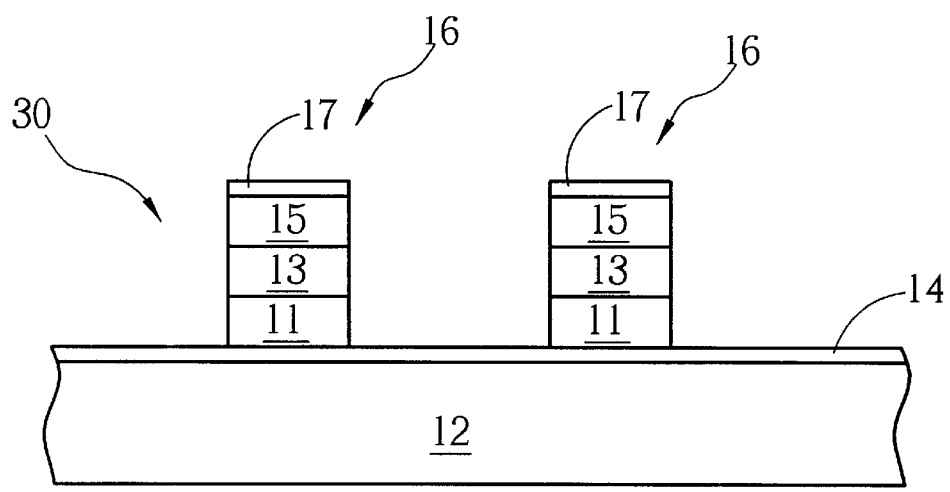
FIG. 6 to FIG. 14 are schematic diagrams of the formation of a MOS transistor according to the present invention.

Please refer to FIG. 6 to FIG. 14. The present invention provides a method of forming a MOS transistor 38 (FIG. 14) on a semiconductor wafer 30, which is used as a pass transistor of a memory cell of dynamic random access memory (DRAM). The semiconductor wafer 30 comprises a silicon substrate 12 and a dielectric layer 14 made of silicon oxide positioned on the silicon substrate 12 that serves as a gate oxide layer. As shown in FIG. 6, a gate 16 is formed on a predetermined region of the dielectric layer 14, which has two vertical sides. The gate 16 comprises a conductive layer 11 positioned on the predetermined region of the dielectric layer 14, a silicide layer 13 positioned above the conductive layer 11 to reduce the interface resistance of the conductive layer 11, a passivation layer 15 positioned above the silicide layer 13, and an anti-reflection coating (ARC) layer 17 positioned above the passivation layer 15. The conductive layer 11 is made of doped poly-silicon, the silicide layer 13 is made of tungsten silicide (WSi), the passivation layer 15 is made of silicon nitride and the ARC layer 17 is made of silicon nitride oxide (SiON).

Figure 7:
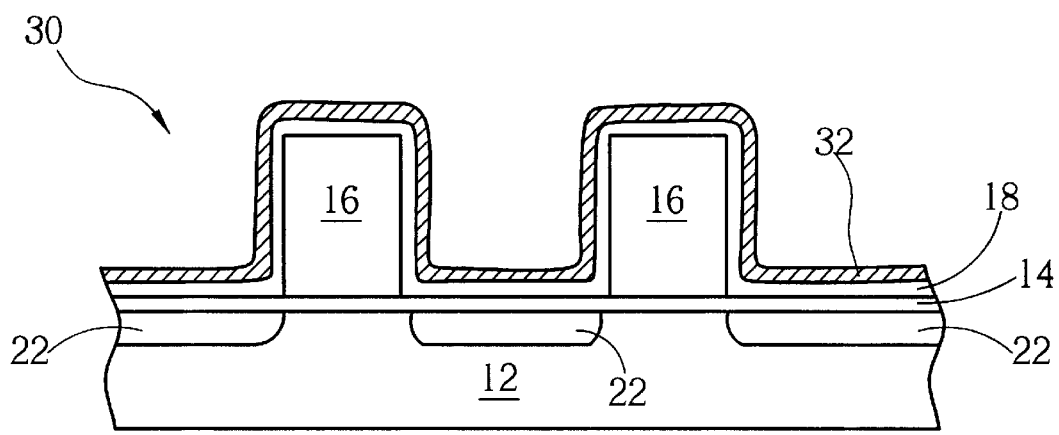

As shown in FIG. 7, a silicon oxide layer 18, 100 Å thick, is formed on the semiconductor wafer 30 that uniformly covers the gate 16 and the dielectric layer 14. Then, a first ion implantation process is performed to form two first doped regions 22 that function as the lightly doped drain of the MOS transistor 38. Then, a second dielectric layer 32, 100 Å thick, is formed on the semiconductor wafer 30, covering the first dielectric layer 18.

Figure 8:
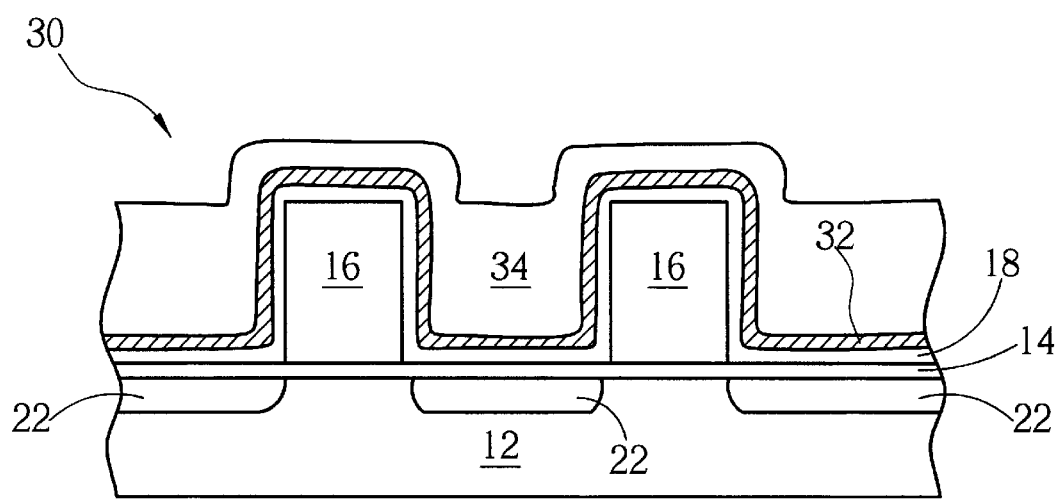
Figure 9:
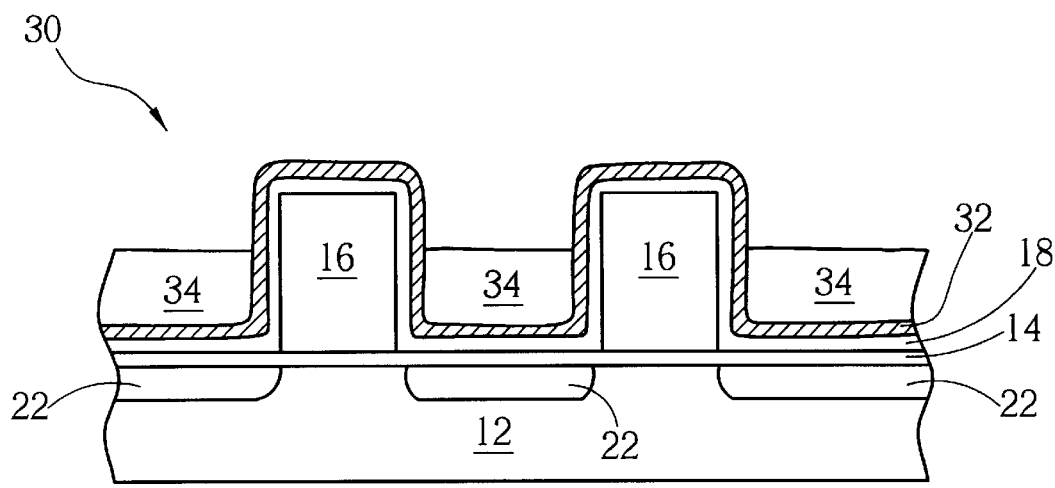
Figure 10:
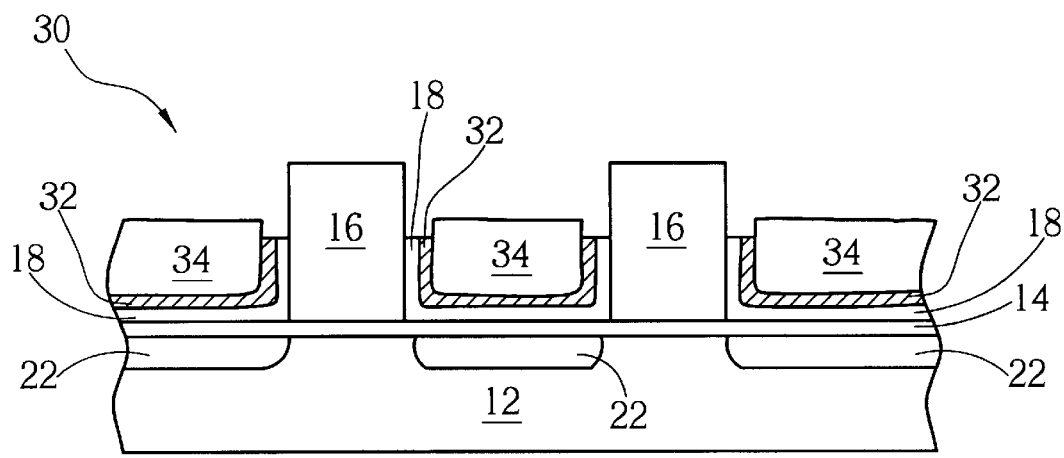
Figure 11:
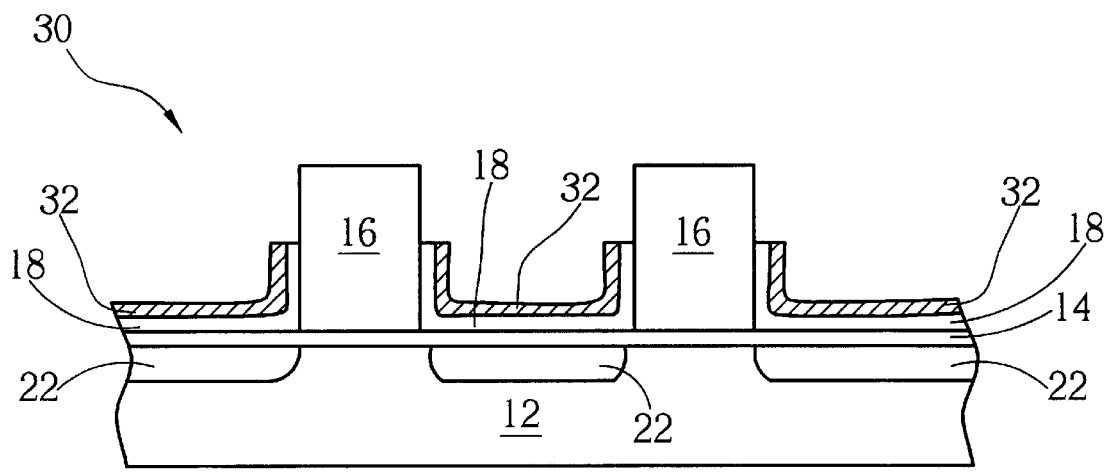

As shown in FIG. 8, a sacrificial layer 34, made of photoresist, is formed on the second dielectric layer 32. As shown in FIG. 9, a first etching process is performed, which is an etch-back process, to uniformly remove the sacrificial layer 34 on top of the gate 16, causing the gate 16 to protrude from the remaining sacrificial layer 34 for a predetermined height. As shown in FIG. 10, a second etching process is performed to remove the first and second silicon oxide layers 18, 32 on the protruding portion of the gate 16; this is a wet etching process that takes buffered oxide etcher (BOE) as the etching solution. As shown in FIG. 11, a photoresist-stripping process is performed to completely remove the remaining sacrificial layer 34.

Figure 12:
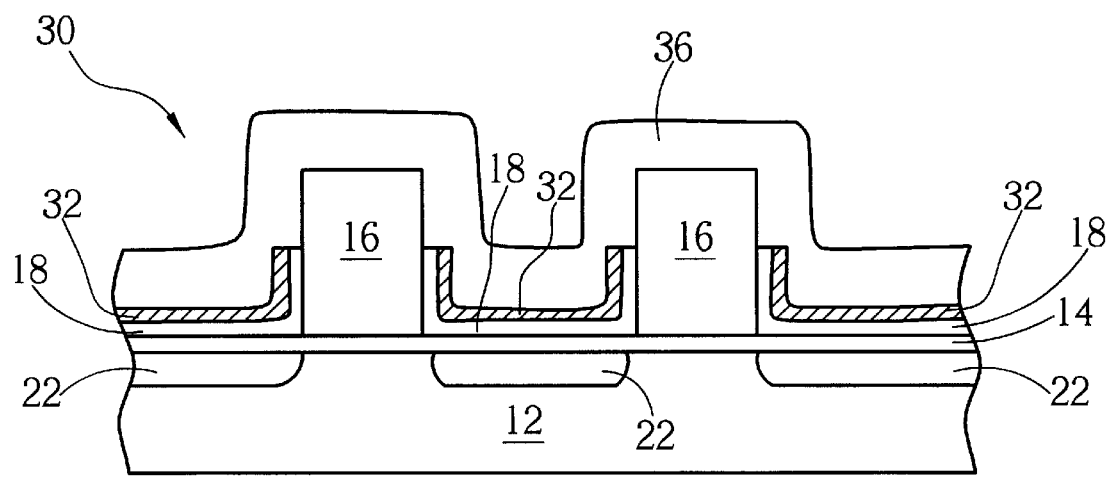
Figure 13:
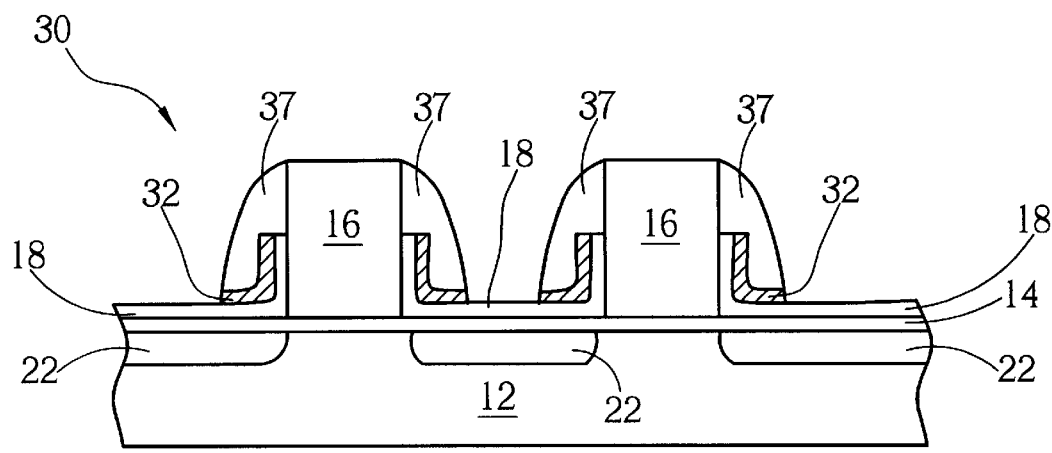
Figure 14:
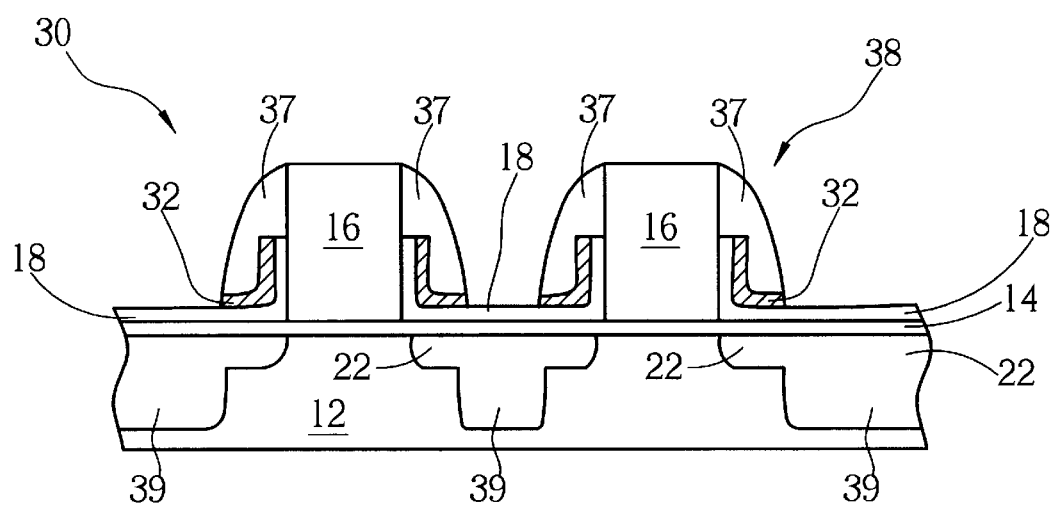

As shown in FIG. 12, a silicon nitride layer 36 is uniformly formed on the semiconductor wafer 30, covering the protruding portion of the gate 16 and the first and second silicon oxide layers 18, 32. As shown in FIG. 13, a third etching process is performed, vertically removing the silicon nitride layer 36 on top of the gate 16 and the first and second dielectric layers 18, 32, thereby forming a spacer 37 on the surrounding portion of the gate 16. As shown in FIG. 14, a second ion implantation process is performed to form two doped areas on the silicon substrate on opposite sides of the spacer that are used as the source and drain of the MOS transistor.

In the present invention, the total thickness of the deposited first and second dielectric layers 18, 32 on the semiconductor wafer 30 is about 200 Å. The sacrificial layer 34 remaining after the first etching process is used as a hard mask for the second etching process to avoid etching of the first and second dielectric layers 18, 32 under the sacrificial layer 34. The remaining first and second dielectric layers 18, 32 on the lower portion of the sides of the gate 16 serve not only as a strain release layer of the subsequent silicon nitride layer 36, but also act as an etching stop layer for the third etching process. Furthermore, the remaining first and second dielectric layers 18, 32 protect the surface of the silicon substrate 12 from damage during the second ion implantation process.

Figure 15:
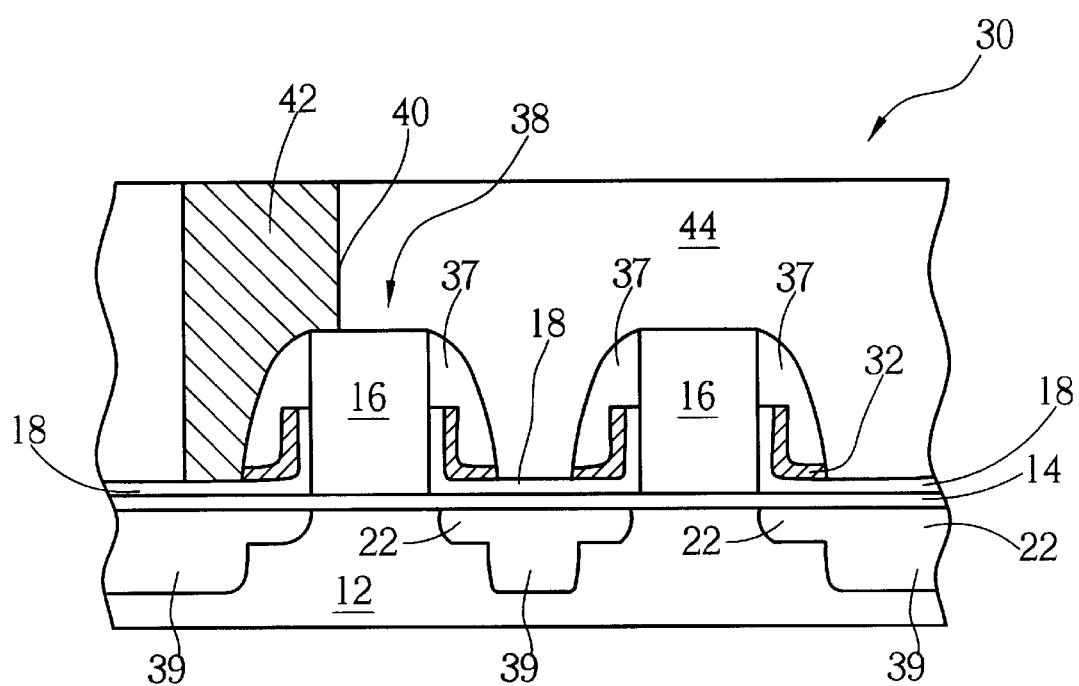
FIG. 15 is a cross-sectional diagram of a contact plug 29 of a MOS transistor shown in FIG. 14.

In addition, the second etching process removal of the first and second silicon oxide layers 18, 32 on the upper portion of the sides of the gate 16 ensures that the subsequent formation of a contact plug will not cause short-circuiting between the gate 16 and the contact plug. Please refer to FIG. 15. FIG. 15 is a cross-sectional diagram of a contact plug 42 of the MOS transistor shown in FIG. 14. After the MOS transistor 38 is completed, the contact plug 42 must be formed on the semiconductor wafer 30 so the MOS transistor 38 has an electrical connection with a subsequent metal layer (not shown). The method comprises depositing another dielectric layer 44 on the semiconductor wafer 30, performing a self-aligned etching process to form a contact hole 40 and filling dielectric material into the contact hole 40 to form the contact plug 42. Since the first and second dielectric layers on the upper portion of the side of the gate 16 have been removed, even if the position of the contact hole 40 is not very precise there still will be no short-circuiting between the gate 16 and the contact plug 42.

In contrast to the prior art method, the first and second silicon oxide layers 18, 32 are formed on the gate 16 and the dielectric layer 14, and the sacrificial layer 34 is used as a hard mask to save a predetermined portion of the first and second silicon oxide layers 18, 32 on the sides of the gate 16. The first and second silicon oxide layers 18, 32 not only act as a strain release layer and an etching stop layer for the silicon nitride layer 36, but they also protect the surface of the silicon substrate 12 and prevent the MOS transistor from short-circuiting during the formation of a subsequent contact plug.

Those skilled in the art will readily observe that numerous modifications and alterations of the device may be made while retaining the teachings of the invention. Accordingly, the above disclosure should be construed as limited only by the metes and bounds of the appended claims.

What is claimed is:

1. A method of forming a metal oxide semiconductor field effect transistor (MOSFET) on a semiconductor wafer, the semiconductor wafer comprising a silicon substrate, and a dielectric layer positioned on the silicon substrate, the method comprising:

forming a gate on at least one region of the dielectric layer;

forming a first silicon oxide layer on the semiconductor wafer, the first silicon oxide layer covering the gate;

performing a first ion implantation process to form two doped areas on the silicon substrate at two opposite sides of the gate that are used as two lightly doped drains of the MOS transistor;

forming a second silicon oxide layer on the semiconductor wafer, the second silicon oxide layer covering the first silicon oxide layer;

forming a sacrificial layer on the second silicon oxide layer;

performing a first etching process to remove the sacrificial layer on top of the gate, making portions of the gate protrude from the remaining sacrificial layer;

performing a second etching process to remove the first and second silicon oxide layers on the protruding portion of the gate;

removing the sacrificial layer;

forming a silicon nitride layer on the semiconductor wafer, the silicon nitride layer covering the protruding portion of the gate and the remaining first and second silicon oxide layers;

performing a third anisotropic etching process to remove the silicon nitride layer on top of the gate and to form a spacer surrounding the gate;

performing a second ion implantation process to form two doped areas on the silicon substrate on two opposite sides of the spacer which are used as source and drain of the MOS transistor.

2. The method of claim 1 wherein the dielectric layer is made of silicon dioxide ($SiO_2$) and is used as a gate oxide layer of the MOS transistor.

3. The method of claim 1 wherein the gate comprises a conductive layer made of doped poly-silicon positioned on the dielectric layer, and a silicide layer positioned on the conductive layer for reducing the interface resistance of the conductive layer.

4. The method of claim 3 wherein the silicide layer is made of tungsten silicide ($WSi_x$).

5. The method of claim 3 wherein the surface of the gate further comprises a silicon nitride layer which is used as a passivation layer, and a silicon-oxy-nitride ($SiO_xN_y$) layer used as an anti-reflection coating (ARC) layer.

6. The method of claim 1 wherein the thickness for each of the first and second silicon oxide layers is about 100 Å.

7. The method of claim 1 wherein the sacrificial layer is made of photoresist.

8. The method of claim 1 wherein the second etching process is a wet etching process that employs buffered oxide etcher (BOE) as the etching solution.

9. The method of claim 1 wherein the third etching process is a dry etching process.

10. The method of claim 1 wherein the MOS transistor is a pass transistor of a memory cell of dynamic random access memory (DRAM).

* * * * *